United States Patent [19]

Argyo

[11] Patent Number: 4,551,216

[45] Date of Patent: Nov. 5, 1985

[54] LAYER CONTAINING CARBON AND A METHOD AND APPARATUS FOR PRODUCING SUCH A LAYER

[75] Inventor: Wilhelm Argyo, Osterwarngau, Fed. Rep. of Germany

[73] Assignee: Siemens Aktiengesellschaft, Berlin & Munich, Fed. Rep. of Germany

[21] Appl. No.: 632,476

[22] Filed: Jul. 19, 1984

[30] Foreign Application Priority Data

Sep. 30, 1983 [DE] Fed. Rep. of Germany ....... 3335623

[51] Int. Cl.$^4$ .............................................. C23C 15/00
[52] U.S. Cl. ................... 204/192 C; 204/192 R; 204/298; 428/408; 428/411.1; 428/489; 428/490; 428/491
[58] Field of Search ............... 204/192 C, 192 R, 298; 423/445; 428/408, 411, 489, 490, 491

[56] References Cited

U.S. PATENT DOCUMENTS

| | | | |
|---|---|---|---|
| 3,840,451 | 10/1974 | Golyanov et al. | 204/192 C |
| 4,173,522 | 11/1979 | Pulker et al. | 204/192 C |
| 4,223,220 | 9/1980 | Feuerbaum | 250/310 |
| 4,228,142 | 10/1980 | Holcombe et al. | 423/445 |
| 4,277,679 | 7/1981 | Feuerbaum | 250/310 |
| 4,412,903 | 11/1983 | Green et al. | 204/192 C |
| 4,437,962 | 3/1984 | Banks | 204/192 C |

OTHER PUBLICATIONS

Marinkovic et al., Carbon, 1976, vol. 14, #6, pp. 329–331.
Zelez, J. Vac. Sci. Technol., A-1, 1983, (Jun.), pp. 305–308.
Holland et al., Thin Solid Films, 48(1978), pp. L21–L23.

Primary Examiner—Arthur P. Demers
Attorney, Agent, or Firm—Hill, Van Santen, Steadman & Simpson

[57] ABSTRACT

A carbon-containing layer is produced on a substrate by means of sputtering. The carbon-containing layer is applied with good adhesion to nearly any substrate, is a very thin layer, and also exhibits a low conductivity. Parts of hydrocarbon molecules or hydrocarbon molecules are both incorporated into the carbon-containing layer during sputtering. The carbon-containing layer adheres well to nearly any substrate, is nearly scratch-proof, and helps avoid charging and contamination upon bombardment with charged particles.

32 Claims, 5 Drawing Figures

FIG 1
(PRIOR ART)
FIG 2
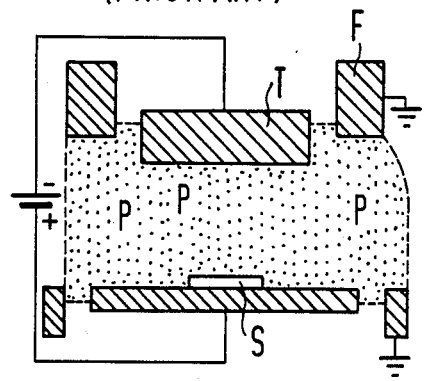
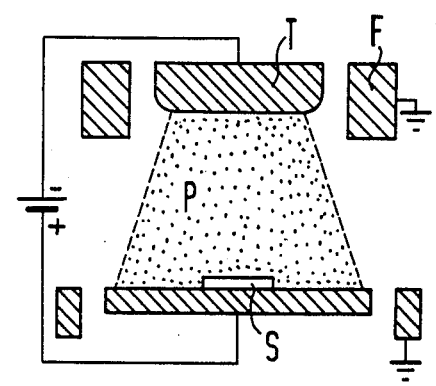
FIG 3
FIG 4
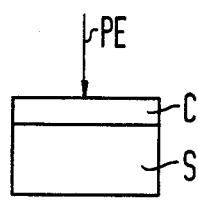
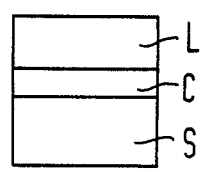
FIG 5
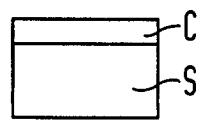

LAYER CONTAINING CARBON AND A METHOD AND APPARATUS FOR PRODUCING SUCH A LAYER

BACKGROUND OF THE INVENTION

The invention relates to a layer containing carbon and a method and apparatus for producing a layer containing carbon on a substrate by means of sputtering.

In electron-microscopic imaging of specimens which consist of insulating material, charges and contaminations occur on the surfaces of the specimens to be imaged as a result of the electron bombardment. These charges and contaminations deteriorate the image quality.

In order to avoid charges on surfaces of the insulating material to be imaged, until now the energy of the electron beam had to be set such that the number of electrons impinging the specimen was equal to the number of emitted electrons, namely the secondary electrons together with the backscattered electrons. When it was not possible to set the energy of the primary electron beam so that the number of electrons impinging the specimen was equal to the number of electrons emitted from the surface to be imaged, the metallic layer allowed the excess charge to discharge and thus helped to avoid a charging of this surface during the irradiation of the surface with the primary electron beam. When this metallic layer was applied to a surface to be imaged in order to prevent charging, it was kept very thin, for example less than 1 nm. Then the charging could be reduced as a result thereof given imaging of surface wave components, for example without the function of these surface wave components being deteriorated. The method of applying a metallic layer for the prevention of charging to a surface to be imaged can be utilized in imaging surface wave components up to frequencies of about 300 MHz. High-frequency shorts which can be observed given both surfaces of surface wave components to be imaged, as well as surfaces of integrated circuits wherein the switching times amount to a few nano seconds, occur at higher frequencies.

In addition to the charging of surfaces to be imaged, contaminations on surfaces to be imaged also deteriorate the image quality. Contaminations can in fact be avoided by means of an oil-free vacuum and by means of a special cleaning of the specimens to be imaged. In electron beam measuring techniques, however, these conditions of an oil-free vacuum and of a special cleaning of the specimens to be imaged cannot be practically met.

Biological, medical or other specimens such as, for example, paper or glass, or ceramic or other surfaces which consist of insulating materials or of materials on which a disruptive contamination can occur, should also be capable of being electron-microscopically imaged. Since metallic layers adhere very poorly to some surfaces which are to be imaged, for example ceramic, a means is required above and beyond use of metallic layers which, on the one hand, aids in preventing charges and contaminations and, on the other hand, adheres well to nearly every possible substrate.

SUMMARY OF THE INVENTION

An object of the present invention is to specify a method for producing a carbon-containing layer and to specify a carbon-containing layer of the type initially cited, whereby the layer adheres well to nearly any substrate, can be applied as a very thin layer, and which also has a very low conductivity.

This object is achieved by incorporating both parts of hydrocarbon molecules or undivided hydrocarbon molecules into the carbon-containing layer during the sputtering.

A layer according to the invention is sputtered onto a substrate with a method according to the invention. The layer contains hydrocarbons in some form or other. Given the inventive method, these hydrocarbons are incorporated into the carbon-containing layer such that the inventive layer thereby arising has many of the physical properties exhibited by a synthetic. For example, a layer according to the invention adheres to substrates such as paper, ceramic or other substances to which, for example, metallic layers would only adhere poorly. When, for example, the layer of the invention is applied to paper, it forms a hard layer on this paper which cannot be scratched off, for example, by rubbing with a finger. When, for example, a further layer, particularly a metallic layer is to be applied to, for example, ceramic from which an applied gold layer, for example, can easily rub off, then a layer of the invention can serve as an adhesion base for the further layer since the layer of the invention is first applied to the ceramic. It adheres very well to ceramic, and the layer actually desired is then applied to the inventive layer. In this fashion, the inventive layer serves as an adhesion promoter for adhering a desired layer on a substrate to which this desired layer would only adhere very poorly without an adhesion promoter.

A layer according to the invention can be applied very uniformly and as a very thin layer having a thickness in the lower nanometer range, for example in the range between 6 nm and 15 nm, particularly between 10 and 15 nm for electron-microscopic investigations. Thinner layers can be obtained with a method of the invention than with a metal vapor deposition. When, for example, a gold layer is vapor-deposited onto a substrate, then a uniformly thick gold layer does not result given a 3 nm thick gold layer. On the contrary, an island formation results given such a thickness of a gold layer, whereby electrical charges which deteriorate the image quality and cause shorts collect at metallic islands in electron-microscopic imagings.

A layer according to the invention is produced by means of sputtering in an atmosphere which contains hydrocarbon molecules in addition to inert gas atoms. These hydrocarbon molecules can be introduced into an apparatus for the implementation of the inventive method. Long chain hydrocarbon molecules such as, for example, oil molecules, seem particularly favorable. For example, a piece of paper that is provided with a drop of oil can be introduced into an apparatus for the implementation of the inventive method. When, given an apparatus for the implementation of the inventive method, vacuum pumps having pump oils are employed, then a poor vacuum, particularly between $10^{-1}$ mbar $10^{-3}$ mbar suffices for the implementation of the inventive method for the introduction of hydrocarbon molecules into the sputtering atmosphere. Pump oils having a relatively high vapor pressure are particularly beneficial in the implementation of the inventive method.

In the sputtering process, a discharge is triggered in a diluted inert gas atmosphere. The inert gas ions are thus extracted from the inert gas plasma by a target which is atomized. Given the inventive method, the target contains carbon atoms. When, after being atomized, the carbon atoms form a coating on the substrate, hydrocarbon atoms are also simultaneously incorporated into this coating with the inventive method. In the inventive method, the carbon atoms and the hydrocarbon atoms diffusely impinge the substrate and effect a coating of uniform thickness.

As a result of the hydrocarbon molecules contained therein, the layer of the invention has a very low conductivity between, in particular, $10^{-13}$ and $10^{-14}\Omega$. The effect of such a conductivity in electron-microscopic imaging is that, on the one hand, the charge carriers are already discharged and, on the other hand, the functions of the substrate to be imaged are not yet disturbed by shorts. The inventive layer is particularly suited for electron-microscopic imaging of both passivated as well as non-passivated electronic components since the electrical functions are not disturbed, in particular, after the application of the inventive layer. The invention permits an irradiation of materials to be imaged with electron beam energies given which the number of primary electrons impinging the specimen differs from the number of electrons emitted by the specimen. The invention also permits a non-destructive qualitative as well as quantitative imaging of specimens.

The inventive layer has a significantly lower conductivity than a pure carbon layer such as can be sputtered on according to the prior art. Like a thin metallic vapor-deposition layer, a carbon layer according to the prior art, however, causes similar shorts in electron-microscopic imaging. Charges are avoided and contaminations are greatly reduced in electron-microscopic imaging by means of the invention. The invention significantly simplifies the quantitative electron-microscopic potential measurement at electronic components and increases its precision. The invention is not restricted to electron-microscopic processes, however. For example, the inventive layer is also suitable for the mechanical protection of an item or as an adhesion promoter in the application of any substance to any substrate if this substance were to adhere poorly to the substrate without an adhesion promoter, or when an adhesion promoter having low conductivity is required.

BRIEF DESCRIPTION OF THE DRAWINGS

FIG. 1 shows an apparatus with which a carbon layer has been sputtered onto a substrate according to the prior art;

FIG. 2 shows an apparatus according to the invention with which a method according to the invention for producing a layer according to the invention can be implemented;

FIG. 3 shows the use of a layer of the invention in electron-microscopic imaging;

FIG. 4 shows the use of a layer of the invention as an adhesion promoter; and

FIG. 5 shows the use of a layer of the invention as a coating of a substrate for mechanical protection.

DESCRIPTION OF THE PREFERRED EMBODIMENTS

FIG. 1 shows an apparatus with which a carbon layer is sputtered onto a substrate S according to the prior art. This sputtering method (cathodic sputtering) utilizes a direct voltage discharge (1.5 kV, 5–10 mA) between parallel plates at a spacing of about 2–5 cm given a gas pressure of about $10^{-2}$ mbar. The target T (cathode) is impinged by the ions from the inert gas plasma P that arises upon gas discharge. These ions from the plasma P extract carbon atoms from the target T. These ions fly to the anode as neutral atoms and produce a carbon layer on the substrate S lying on the anode. Argon is employed, for example, as the inert gas charge. The free path length of the carbon atoms is less than the spacing of the plates, whereby the carbon atoms diffusely impinge the substrate S.

FIG. 2 shows an apparatus according to the invention with which a method of the invention for producing the layer of the invention can be implemented. A sputtering installation according to the prior art, for example a sputtering installation of the Technis Co. (Hummer Junior) must be modified in the following manner in order to be able to produce the layer of the invention:

1. The edge of the target is rounded off: This prevents arcing to the apparatus ground via the focussing ring F.

2. The surface of the target T is ground as smoothly as possible: a significantly higher discharge sputtering rate is thus achieved.

3. The disposition of the target T is modified: As a result thereof, the plasma P is focussed better on the space between the substrate S to be coated and the surface of the target T.

A sputtering according to the invention of an inventive layer with a sputtering installation according to the described prior art is not possible without these measures 1 through 3. The feature that the surface of the target T is ground as smoothly as possible has the most far-reaching consequences for the sputtering according to the invention. As a result thereof, a large number of carbon atoms can be simultaneously sputtered off from the target T. The next most important effect for a method according to the invention is produced by the feature that the plasma P is as well-focussed as possible to the space between the substrate S and the surface of the target T. For this purpose, a part of the focussing means F is disposed between the surface of the target T and the substrate S. Of the three cited measures, the rounding off of the surface of the target T has the least effect. The result of this rounding is that the voltage for the gas discharge remains effective with chronological uniformity.

Important for the inventive method is that the hydrocarbon molecules that are situated between the surface of the target T and the substrate S are caused to deposit on the substrate S in some manner or other during the sputtering. This is carried out in a particularly effective manner in that long-chain hydrocarbon molecules are also cracked or broken during the gas discharge and are thereby quasi-atomized just like the carbon atoms, and that parts of long-chain hydrocarbon atoms form a diffuse deposit on the substrate S in common with the atomized carbon atoms. The conductivity and the hardness of the inventive layer on the substrate S can be influenced by means of the number and type of hydrocarbon molecules that are situated between the target T and the substrate S. The inventive layer generated on the substrate S becomes all the harder and all the more resistant the more long-chain hydrocarbon molecules are situated between the target T and the substrate S.

FIG. 3 shows the employment of an inventive layer for electron-microscopic imaging. An inventive layer C which contains hydrocarbon molecules has been applied with an inventive method to a substrate S to be imaged. When a primary electron beam PE impinges this inventive layer, then the surface of the substrate can be imaged in a known manner. Given qualitative imaging of a substrate S, the teaching of U.S. Pat. No. 4,223,220, incorporated herein by reference, can be applied and the teaching of U.S. Pat. No. 4,277,679, incorporated herein by reference, can be applied given the quantitative imaging of the substrate S. The inventive layer C thus enables an accelerating voltage of, for example, 2.5 kV for the primary electron beam PE without having charging of the surface to be imaged occurring and deteriorating the image quality. An inventive layer C suitable for an electron-microscopic imaging is obtained, for example, after 5–10 min sputtering time with an inventive apparatus according to FIG. 2.

When the substrate S is an electronic module and is driven with an operating voltage, no shorts occur given direct voltage signals and given radio-frequency signals with this operating voltage. An integrated circuit can therefore also be employed as substrate S. The greatly reduced influence of contamination is also advantageous. This has an overall positive effect on a quantitative measurement of electronic components. Moreover, the specimens can be exposed to the electron bombardment for a longer time as a result thereof.

FIG. 4 shows the employment of an inventive layer C as an adhesion promoter between a substrate S and a further substrate L. For example, a metallic substance such as gold adheres poorly to ceramic without an adhesion promoter. An inventive layer C effects good adhesion of gold to ceramic when it is disposed between the ceramic and gold as an adhesion promoter.

FIG. 5 shows the employment of an inventive layer C for the mechanical protection of a substrate S. The inventive layer C thus prevents mechanical damage to the substrate S.

An inventive layer C can serve not only for the mechanical protection of a substrate S but also for protection against charges or shorts.

An inventive layer C can be eliminated in residue-free fashion from a specimen C by means of plasma etching with oxygen without the specimen being destroyed. This is not possible at all or only possible with difficulty given a metallic layer on a specimen. Also with the invention, manufacture time is reduced and cost is lowered in comparison to coating a specimen with a very thin metal film.

To carry out the inventive method, the previously mentioned oil molecules are introduced in the apparatus according to a preferred embodiment. The oil molecules, for example, may be what is known in the trade as "Forevacuum" pump oil of the Alcatel Company or the Leybold Company. Also commercial diffusion pump oil or commercial vacuum greases can be employed.

Although various minor changes and modifications might be proposed by those skilled in the art, it will be understood that I wish to include within the claims of the patent warranted hereon all such changes and modifications as reasonably come within my contribution to the art.

I claim as my invention:

1. In a method for producing a carbon-containing layer on a substrate by means of sputtering, wherein the improvement comprises:
    incorporating at least one of the materials selected from the group consisting of hydrocarbon molecules and parts of hydrocarbon molecules into the carbon-containing layer during the sputtering by providing an inert gas/hydrocarbon atmosphere between a target and said substrate.

2. A method according to claim 1 including the step of simultaneously sputtering off a large number of carbon atoms from a target.

3. A method according to claim 1 including the step of grinding the surface of a target as smooth as possible.

4. A method according to claim 1 including the step of focussing a plasma as well as possible in a direction toward the substrate.

5. A method according to claim 1 including the step of positioning at least one part of a focussing means for focussing the plasma between the surface of the target and the substrate.

6. A method according to claim 1 including the step of maintaining effective the voltage for the gas discharge with chronological uniformity.

7. A method according to claim 1 including the step of rounding off the edges of said target in order to prevent voltage arcs between said target and other devices.

8. A method according to claim 1 including the step of employing a vacuum between $10^{-1}$ and $10^{-3}$ mbar.

9. In a carbon-containing layer sputtered onto a substrate, wherein the improvement comprises:
    at least one of the materials selected from the group consisting of hydrocarbon molecules and parts of hydrocarbon molecules incorporated in the carbon-containing layer.

10. A carbon-containing layer according to claim 9 wherein the layer has a conductivity between $10^{12}$ and $10^{-15}\Omega$.

11. A carbon-containing layer according to claim 9 wherein the layer has a thickness between 6 and 15 nm.

12. A carbon-containing layer according to claim 9 wherein the layer has an abrasion resistance on a majority of substrates to which such layers are applied.

13. In a combination of a carbon-containing layer sputtered on a substrate, the improvement comprising:
    at least one of the materials selected from the group consisting of hydrocarbon molecules and parts of hydrocarbon molecules being incorporated in the carbon-containing layer.

14. The combination of claim 13 wherein the substrate is paper.

15. The combination of claim 13 wherein the substrate is an insulator.

16. The combination of claim 13 wherein the substrate is ceramic.

17. A material protecting method comprising the steps of:
    sputtering onto a material to be protected a carbon-containing layer having incorporated therein at least one of the materials selected from the group consisting of hydrocarbon molecules and parts of hydrocarbon molecules, an inert gas/hydrocarbon atmosphere being provided between a target and said material to be protected during the sputtering.

18. An adhesion promoter method, comprising the steps of:
    providing a substrate to which it is desired to adhere a desired layer which normally would not favorably adhere to the substrate;
    sputtering a carbon-containing layer on the substrate and incorporating in the sputtered on layer at least one of the materials selected from the group consisting of hydrocarbon molecules and parts of hydrocarbon molecules, an inert gas/hydrogen atmosphere being provided between a target and said substrate during the sputtering; and applying the desired layer to the carbon-containing layer incorporating said material whereby said desired layer adheres to the carbon-containing layer.

19. The method of claim 18 wherein the desired layer is a metallic layer.

20. An electron-microscopic surface and imaging method, comprising the steps of:

providing a specimen, a surface of which is to be electron-microscopic imaged;

applying to said surface in a sputtering process a carbon-containing layer having incorporated therein at least one of the materials selected from the group consisting of hydrocarbon molecules and parts of hydrocarbon molecules, an inert gas/hydrocarbon atmosphere being provided between a target and the specimen during the sputtering process; and electron-microscopic imaging said surface with the carbon-containing layer adhered thereon wherein the carbon-containing layer substantially reduces charges and contaminations from occurring on the surface of the specimen as a result of electron bombardment during imaging.

21. The method of claim 20 including the step of electron-microscopic imaging a passivated surface of an electronic component which is the specimen.

22. The method according to claim 20 including the step of electron-microscopic imaging a nonpassivated surface of an electronic component which is the specimen.

23. A method according to claim 20 including the step of electron-microscopic imaging a surface of a surface wave filter which is the specimen.

24. A method according to claim 20 including the step of providing the specimen as an insulator and electron-microscopic imaging the surface thereof.

25. An apparatus for producing a carbon-containing layer on a substrate by means of sputtering, comprising:

a sputtering chamber having an anode with a substrate thereon and a cathode target;

a potential connected between the anode and cathode;

an inert gas plasma which arises in the chamber upon a gas discharge in the chamber;

said target comprising carbon and wherein carbon material can be extracted from the target when impinged upon by the plasma ions; and means for introducing in the plasma during the sputtering at least one of the materials selected from a group consisting of hydrocarbon molecules and parts of hydrocarbon molecules whereby a carbon layer containing said element is formed on the substrate associated with the anode.

26. The apparatus of claim 25 wherein the surface of the cathode target is ground as smooth as possible.

27. An apparatus according to claim 25 wherein means are provided for focussing the plasma in the direction toward the substrate.

28. The apparatus according to claim 25 wherein the edge of the target anode is rounded off.

29. A method for producing a carbon-containing layer on a substrate, comprising the steps of:

providing a sputtering chamber with an anode, a cathode target, a substrate therein having a surface to be coated with the carbon-containing layer, and the target containing carbon atoms which can be released upon impingement by ions from a gas plasma to be produced in the sputtering chamber;

providing a potential between the anode and cathode target;

providing a gas plasma in the sputtering chamber; and introducing during the sputtering in the gas plasma at least one material selected from the group consisting of hydrocarbon molecules and parts of hydrocarbon molecules whereby the carbon layer formed on the substrate has incorporated therein said element.

30. The method according to claim 29 wherein long-chain hydrocarbon molecules are introduced into the gas plasma.

31. A method according to claim 30 wherein oil molecules are introduced into the gas plasma as said long-chain hydrocarbon molecules.

32. A method for producing a carbon-containing layer on a substrate, comprising the steps of:

providing a sputtering chamber with an anode, a cathode target whose surface has been ground smooth, a substrate therein having a surface to be coated with the carbon-containing layer, a focusing element extending beyond the smooth surface of the target toward the substrate, and the target containing carbon atoms which can be released upon impingement by ions from a gas plasma to be produced in the sputtering chamber;

providing a potential between the anode and cathode target;

providing a gas plasma in the sputtering chamber;

focusing the gas plasma in a direction toward the substrate with the focusing element; and introducing during the sputtering in the gas plasma at least one material selected from the group consisting of hydrocarbon molecules and parts of hydrocarbon molecules whereby the carbon layer formed on the substrate has incorporated therein said at least one material.

* * * * *